United States Patent [19]

Boler et al.

[11] Patent Number: 4,797,724
[45] Date of Patent: Jan. 10, 1989

[54] REDUCING BIPOLAR PARASITIC EFFECTS IN IGFET DEVICES

[75] Inventors: Clifford H. Boler, New Hope; Marc D. Hartranft, Brooklyn Park; Thomas E. Hendrickson, Wayzata, all of Minn.

[73] Assignee: Honeywell Inc., Minneapolis, Minn.

[21] Appl. No.: 393,891

[22] Filed: Jun. 30, 1982

[51] Int. Cl.$^4$ .................... H01L 27/04; H01L 29/78
[52] U.S. Cl. ................................ 357/42; 357/12; 357/13; 357/23.1; 357/86; 437/34; 437/57
[58] Field of Search .............. 357/12, 13, 59, 42, 357/86, 90, 23.1; 437/34, 57

[56] References Cited

U.S. PATENT DOCUMENTS

| | | | |
|---|---|---|---|
| 3,641,403 | 2/1972 | Nakata | 357/12 |
| 3,955,210 | 5/1976 | Bhatia et al. | |
| 4,035,826 | 7/1977 | Morton et al. | 357/42 |
| 4,167,747 | 9/1979 | Satou et al. | |
| 4,173,767 | 11/1979 | Stevenson | |
| 4,271,424 | 6/1981 | Inayoshi et al. | 357/59 |

FOREIGN PATENT DOCUMENTS 53-123679 10/1978 Japan .................... 357/23 R

OTHER PUBLICATIONS

"Elimination of Latchup in Bulk CMOS", R. S. Payne, W. N. Grant and W. J. Bertram, pp. 248–251.

Primary Examiner—William D. Larkins
Attorney, Agent, or Firm—William T. Udseth

[57] ABSTRACT

An IGFET is presented which includes a relatively low resistance path across the source-substrate junction to prevent parasitic bipolar effects while maintaining high component density in integrated circuits. The low resistance path across the source-substrate junction is formed by various methods including damaging the crystal structure at the junction interface, supplementing the damaged junction with a heavily doped region underlying the source region and spiking metallurgy. A particular application of the invention allows the prevention of latchup in CMOS devices. The invention also allows the source region of an IGFET to serve the dual functions of a source for a MOSFET as well as an ohmic contact to the underlying well or substrate.

3 Claims, 5 Drawing Sheets

REDUCING BIPOLAR PARASITIC EFFECTS IN IGFET DEVICES

BACKGROUND OF THE INVENTION

1. Field of the Invention

This invention relates to insulated gate field effect transistors (IGFETS) and more particularly to the reduction of parasitic bipolar effects, including "latchup", in complementary metal oxide semiconductor (CMOS) circuits by reducing the resistance across the source-substrate and source-well junctions.

2. Prior Art

It is well known that parasitic lateral and vertical bipolar transistors are formed in CMOS circuits. Further, recently the phenomenon of "latchup" due to regenerative thyristor action between the vertical and lateral parasitic bipolar transistors has been studied and various solutions proposed. For example, Satou et al in U.S. Pat. No. 4,167,747 proposed various methods to prevent the initial activation of the parasitic thyristor including increasing the base width of one or both of the 4,035,826 proposed providing low resistance contacts to the substrate of an IGFET by providing doped conductive paths to the substrate which contact the surface through and within the boundaries of the IGFET source region. Stevenson in U.S. Pat. No. 4,173,767 proposed sinking a deep region in the epitaxial substrate of a CMOS and doping the deep region with the opposite conductivity type of the epitaxial substrate. The deep region is to be located between the respective drains of the CMOS. Bhatia et al in U.S. Pat. No. 3,955,210 proposed guard rings of the same conductivity type as the channel type of the respective MOSFET as a means to drain off parasitic bipolar collector current thereby preventing latchup.

Payne, et al ("Elimination of Latch-up in Bulk CMOS", 1980 IEDM, Pages 248-251) suggested the addition of an N+ surface diffusion tied to $V_{DD}$ in an N-substrate and placed adjacent one source of a CMOS, and a P+ diffusion tied to $V_{SS}$ in a P-well and placed adjacent the other source of the CMOS, as a means of reducing lateral potential buildup in the CMOS.

Each of the above proposed solutions continues to present difficulties. Increasing the base width of the lateral or vertical parasitic transistors increases bulk and/or reduces component density. Gold is a well known contaminant of semiconductor processing equipment and it would be preferable to devise a method for reducing CMOS latchup which does not involve doping the substrate with gold and, likewise, it is preferable to devise a structure for reducing CMOS latchup which is not doped with gold. Providing conductive paths through the source region of a CMOS which are doped opposite the source region doping, entails critical masking steps and could increase source surface area which would reduce component density in IC's. Similarly, the solution suggested by Payne, et al increases lateral source dimensions.

Furthermore, a primary concern in preventing latchup is reducing the voltage drop resulting from unwanted current injected through CMOS drains exiting the CMOS at points distant from the injection site. One method of reducing the voltage drop is to bring the injection site and exit point into close proximity. At a minimum, the structure proposed by Payne et al requires current injected through a drain to travel the entire width of a MOSFET'S corresponding source region to reach the exit point. Reducing this travel distance further would increase the probability of preventing latchup due to the unwanted injected current. Also, Stevenson's and Bhatia's solutions require an additional doped region between MOSFETS thereby again impeding high density IC's as well as requiring further processing.

Another area conservative problem in CMOS devices is presented by the past use of doped ohmic contact region adjacent or separated by a small distance from each source in the CMOS. One ohmic contact was typically heavily doped with the same conductivity type as the well and the other ohmic contact was typically heavily doped with the same conductivity type as the substrate. These ohmic contacts were connected to the supply and negative (or ground) voltages to hold the substrate and well at the same potentials as the source regions therein. This in turn kept the source-well and source-substrate junctions unbiased thus preventing unwanted minority carrier injection across these junctions. Often, guard rings which are placed around the respective MOSFETS of the CMOS to isolate the MOSFETS from one another can perform this additional task of ohmic contacts to the well and substrate.

Use of such extra ohmic contacts and/or guard rings clearly reduced potential component density in IC's. Elimination of these extra ohmic contacts while still keeping the source-well and source-substrate junctions unbiased under normal operating conditions would allow increased component density in IC's.

SUMMARY OF THE INVENTION

A principal object of the present invention is to provide an area conservative means of reducing parasitic bipolar effects in IGFETS.

A further object of the present invention is to provide a CMOS integrated circuit free from parasitic latchup effects which utilizes an area conservative structure.

A further object of the present invention is to provide a MOSFET with a source region that serves the dual role of a source region and an ohmic contact to the channel region.

The present invention provides various means and methods of reducing parasitic bipolar effects in IGFETS, and more particularly, for preventing "latchup" in CMOS integrated circuits by area conservative means. A first method creates a low resistivity path (i.e., low relative to the resistance presented to injected minority charge carriers by an unbiased source-substrate or source-well junction) between the well or substrate of the CMOS MOSFETS and their respective source regions by damaging the source-substrate and source-well PN junctions at the lower boundaries of the source regions. The damaged regions may, but need not, extend to the surface of the source and may, but need not, encompass the entire length of the lower boundaries of the source regions.

The second method and means enhances the first method and means by forming a heavily doped region of opposite conductivity type to the respective overlying source, under each of the source regions, and very heavily doping each source region. Third and fourth method and means short the source-well and source-substrate junctions by providing spiked metallurgical conductive paths through the lower boundaries of the respective source regions. The third and fourth embodiments differ from each other in the formation and structure of the drain regions, the former using an extra deep drain region profile and the latter using a metallic barrier beneath the drain region contacts to prevent spiking of the drain regions.

In the first and second embodiments, the source-well and source-substrate junctions are damaged by preferably ion implanting heavily doped source regions, annealing the source regions to activate the dopants and then ion implanting again to damage the crystal lattice structure at the lower boundaries of the sources. The subsequent damage must be sufficient to reduce the resistance of the source-well and source-substrate junction to unwanted injected current to a point where the threshold voltage of the corresponding parasitic bipolar transistor is not exceeded when the unwanted current exits through the particular source region. Further annealing of the source regions between the damaged junctions and the surface may be performed after the second implant.

BRIEF DESCRIPTION OF THE DRAWINGS

FIGS. 7A through 7F show the results of the steps of a method of making a device incorporating the first embodiment of the present invention.

DESCRIPTION OF THE PREFERRED EMBODIMENTS

The present invention may be employed advantageously to reduce parasitic bipolar effects in any circuit which utilizes IGFETS as a circuit element. However the present invention is particularly useful in CMOS circuits. Common CMOS circuits are transmission gates, NOR and NAND logic gates and inverters. The present invention will be applied to a CMOS inverter. However, the invention's immediate adaptability to other CMOS circuits will be readily apparent to one skilled in the art. N and P refer to dopants of N and P-type conductivity.

Figure 1:
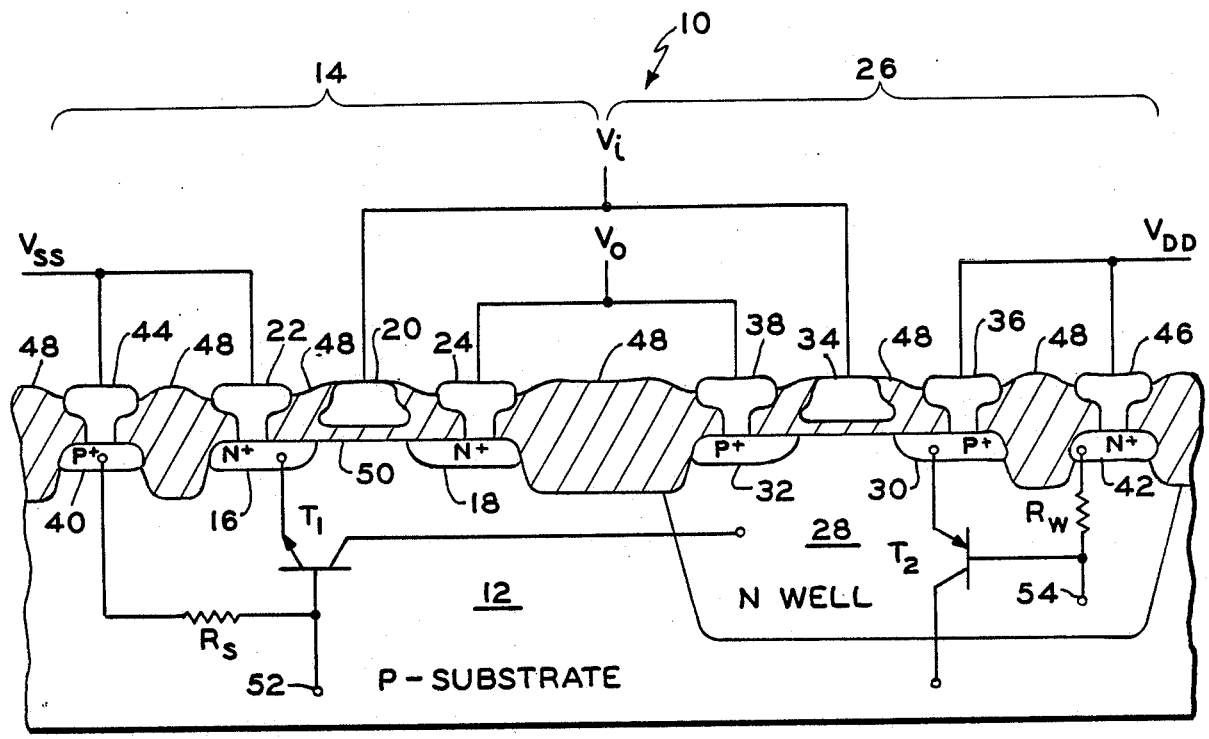
FIG. 1 is a schematic cross section of a prior art CMOS circuit with parasitic lateral and vertical bipolar transistors superimposed thereon.

The known, basic CMOS inverter 10 is shown in FIG. 1. Inverter 10 includes a monocrystalline P-type substrate 12, a first MOSFET 14 (an N-channel, enhancement mode MOSFET) having an N+ source 16, N+ drain 18 and heavily doped, polysilicon gate 20. A metallized source contact 22 for source 16 is connected to a negative voltage $V_{SS}$, and a metallized drain contact 24 for drain 18 is connected to output terminal $V_o$. A second MOSFET 26 (a P-channel, enhancement mode MOSFET) is formed in an N-well 28 which extends into substrate 12. MOSFET 26 includes P+ source region 30, P+ drain region 32 and heavily doped, polysilicon gate 34. A metallized source contact 36 for source 30 is connected to the positive voltage $V_{DD}$. A metallized drain contact 38 for drain 32 is connected to $V_o$. Ohmic contacts to the substrate 12 and N-well 28 are formed by P+ region 40 and N+ region 42, respectively. Metallized contacts 44 and 46 connect substrate 12 and 28 to $V_{SS}$ and $V_{DD}$, respectively. Gates 20 and 34 are each connected to input terminal $V_i$. Field oxide 48 insulates gates 20 and 34 from substrate 12 and well 28, respectively, and serves as a passivation layer for upper, principal surface 50 of substrate 12.

The function of CMOS integrated circuit 10 is well known. When the input to inverter 10 is zero volts (i.e., $V_i$ is at zero volts or $V_{SS}$, which is logic condition zero), the N channel transistor 14 is turned off, and the P channel transistor 26 is turned on. Thus, for the input held at a logic zero, a low impedance path exists from the output $V_o$ to $V_{DD}$, and a high impedance path exists between $V_o$ and $V_{SS}$ (ground). $V_o$, therefore, approaches $+V_{DD}$ (logic 1) under normal loading conditions. When the input $V_i$ is at $+V_{DD}$ (logic 1), the situation is reversed, and $V_o$ approaches $V_{SS}$ (logic zero).

Under normal operating conditions, the various parasitic devices inherent to CMOS 10 will not affect the basic inverter function of the circuit. However, operation of CMOS 10 outside of its design parameters can result in substantial impairment to circuit function and possibly permanent damage. Environmental noise applied impulsively to the output or supply voltage, or a sharp fluctuation in input voltage, are common ways in which circuit design parameters are exceeded and current can be injected through drains 24 or 38, or excessive current conducted in the inversion layers formed under gates 20 and 34 when either transistor 14 or 26 is turned on.

Whatever the cause of the excessive current appearing in substrate 12 or well 28, such current can drive a parasitic thyristor device found in CMOS 10 into latchup. The most likely parasitic devices to cause latchup problems are a lateral N P N transistor $T_1$ formed between source 16, substrate 12 and well 28, and a vertical P N P transistor $T_2$ formed between source 30, well 28 and substrate 12. If a positive impulse noise current $+I_N$ is applied to $V_o$, it will enter substrate 12 through drain 18. Thereafter, $+I_N$ will flow through substrate 12 and its corresponding resistance $R_s$, to ground by way of ohmic contact 40. Similarly a negative impulse noise current $-I_N$ entering well 28 through drain 32 will flow to $V_{DD}$ through well 28 and its corresponding resistance, $R_w$. Such positive and negative noise currents will be shunted through resistances $R_s$ and $R_w$ as opposed to exiting device 10 through sources 16 and 30 because said sources are part of respective unbiased PN junctions with resistances that far exceed $R_s$ and $R_w$.

If the output node, $V_o$ of device 10 is connected to further circuitry which provides a DC path to other supply voltages, such other supply voltages are additional possible current sources which could trigger and sustain latchup. If $V_o$ is instead connected to the input of another CMOS device 10, $V_o$ would be capacitively isolated from the successive stages, thus possibly reducing the chance (relative to the first connection scheme immediately above) of $V_o$ serving as an injection point for excessive current. Further, said first connection scheme will likely render $V_o$ more susceptible to it serving as a source of current due to environmental noise.

Figure 2:
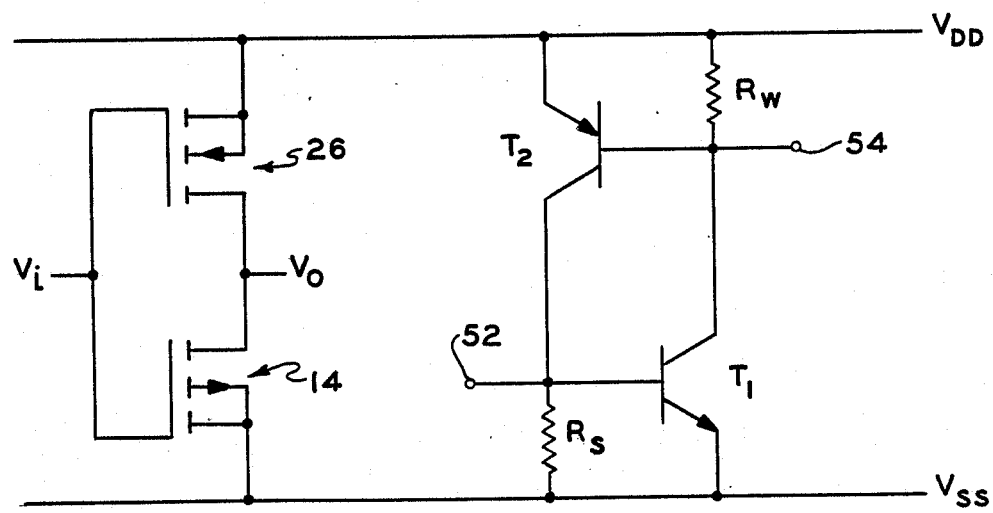
FIG. 2 is a schematic circuit of FIG. 1.

A schematic representation of CMOS 10 including parasitic bipolar transistors $T_1$ and $T_2$ is shown in Figure 2. As FIG. 2 indicates, $T_1$ and $T_2$ interconnect in the familiar thyristor arrangement with the collector of each being electrically in common with the base of the other. There are other parasitic bipolar transistors in CMOS 10 (for example, a P N P transistor from drain 32 to well 28 to substrate 12) but it is found that $T_1$ and $T_2$ are the primary cause of parasitic bipolar effects in CMOS circuits.

As is well known $T_1$ and $T_2$ will function as a thyristor if $T_1$ or $T_2$ is turned on, the products of the current gains of $T_1$ and $T_2$ is greater than or equal to 1 (i.e., $B_1 \times B_2 \geq 1$) and the power supply is capable of providing the minimum holding current. When these three conditions are satisfied, a regenerative current flow occurs by way of collector currents IC1 and IC2. Therefore, even if no further current is injected into the base of either $T_1$ or $T_2$ current will continue to flow in the collectors of both transistors. Normally, the current gain for lateral transistor $T_1$ is between 1 and 10, and the current gain for vertical transistor $T_2$ is on the order of several hundred.

If only the first two conditions for thyristor action are met, SCR firing (a short term effect) will occur but the thyristor will not remain on. SCR firing is a non-sustaining thyristor action whereas "latchup" is a sustaining action. Both types of thyristor action can damage a CMOS.

Positive noise current injected into substrate 12 appears in the schematic of FIG. 2 at the base of $T_1$ at point 52. Since the emitter-base junction resistance of $T_1$ is initially much larger than $R_s$, such positive noise current will flow through $R_s$ to $V_{ss}$. If a sufficient voltage drop is created across $R_s$, $T_1$ will turn on and the regenerative loop will be activated. Similarly, negative current is injected into well 28 in FIG. 2 at point 54. The initial high junction resistance between the base and emitter of $T_2$ ensures that this negative current will flow through $R_w$ to $V_{DD}$. Again, a sufficient voltage drop will turn $T_2$ on and activate the regenerative loop.

The present invention presents various methods and means to prevent $T_1$ or $T_2$ from turning on when excessive current appears in substrate 12 or well 28. In particular, the base-emitter junctions of $T_1$ and $T_2$ are shorted through relatively low resistance paths. According to one analysis of these methods, resistances $R_w$ and $R_s$ are reduced to the point that an insufficient voltage drop will occur, due to injected current flowing through $R_s$ and $R_w$, for $T_1$ or $T_2$ to turn on. In another analysis, the base and emitter junctions themselves of $T_1$ and $T_2$ are virtually eliminated by shorting the junctions through the relatively low resistance paths. By either analysis, the thyristor action of transistors $T_1$ and $T_2$ is prevented and CMOS 10 can operate free from major parasitic bipolar transistor current effects.

Figure 3:
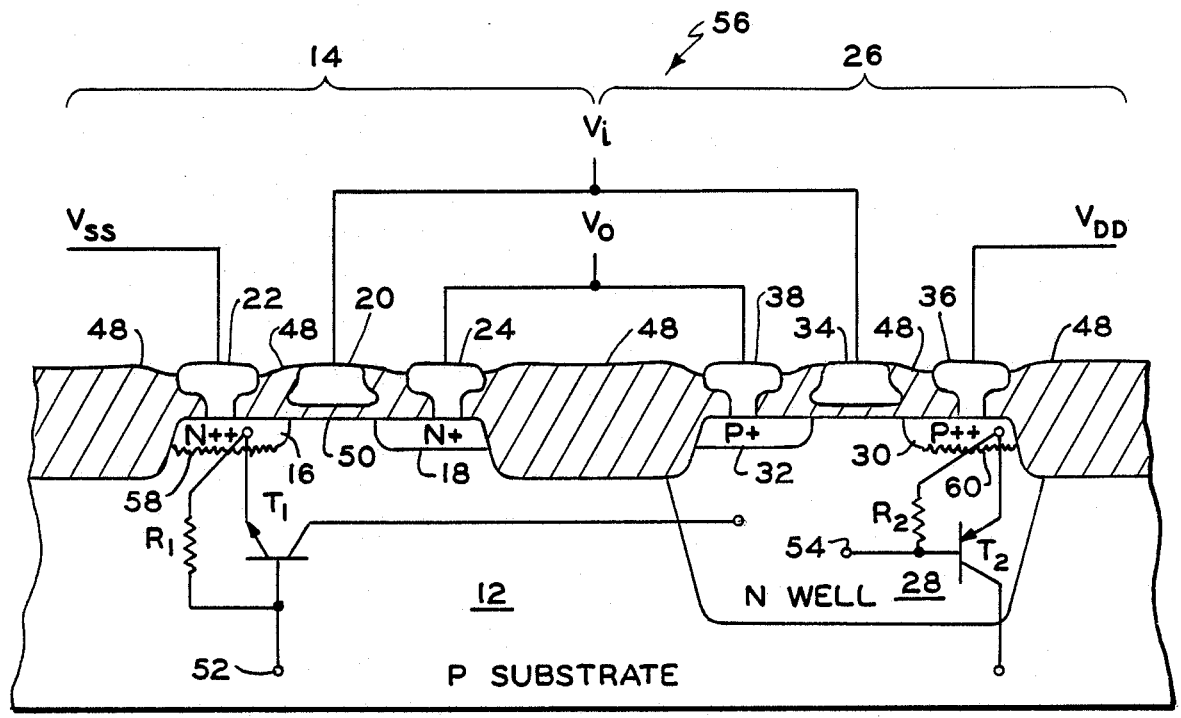
FIG. 3 is a schematic cross sectional view of a CMOS circuit in accordance with the first embodiment of the present invention with lateral and vertical parasitic bipolar transistors superimposed thereon.

The first embodiment of the present invention is shown in FIG. 3 as CMOS device 56. Where possible, corresponding structure in devices 10 and 56 are numbered the same for clarity. MOSFETS 14 and 26 are basically the same in devices 10 and 56 except that contact regions 40 and 42 are deleted in device 56. Parasitic transistors $T_1$ and $T_2$ are again the same as in CMOS 10 except that their base-emitter junctions are modified in accordance with the present invention.

The source 16-substrate 12 and source 30-well 28 junctions of MOSFETS 14 and 26, respectively, are unbiased. In device 10, the unbiased condition was provided by connecting sources 16 and 30 directly to $V_{ss}$ and $V_{DD}$, respectively, and by connecting substrate 12 and well 28 to $V_{SS}$ and $V_{DD}$ respectively, through ohmic contacts 40 and 42. In device 56, ohmic contacts 40 and 42 can be eliminated because portions of the source 16-substrate 12 junction of transistor 14 and the source 30-well 28 junction of transistor 26, are made very "leaky". That is, a leakage means is provided through a portion of these junctions. A "leaky junction" is well known as a junction which presents a low potential barrier, relative to an unbiased junction, to majority as well as minority carriers. Generally, the potential on each side of the junction is nearly the same. A leaky junction can be provided by forming a low resistivity path, relative to an unbiased junction, across the lower boundary of either sources 16 and 30. The "lower boundary" herein refers to the location of that portion of the source 16 - substrate 12 and source 30- well 28 $P_N$ junctions which are opposite or remote from principal surface 50. The presence of a leaky junction at the lower boundaries of source 16 and 30 essentially eliminates the base-emitter junctions of transistors $T_1$ and $T_2$.

It should be noted that virtually all $P_N$ junctions leak to some degree. However, this inherent leakage is to be distinguished from the "leaky junction" described above. Also, a method of testing for a sufficiently leaky junction in accordance with the present invention is included below.

Figure 4:
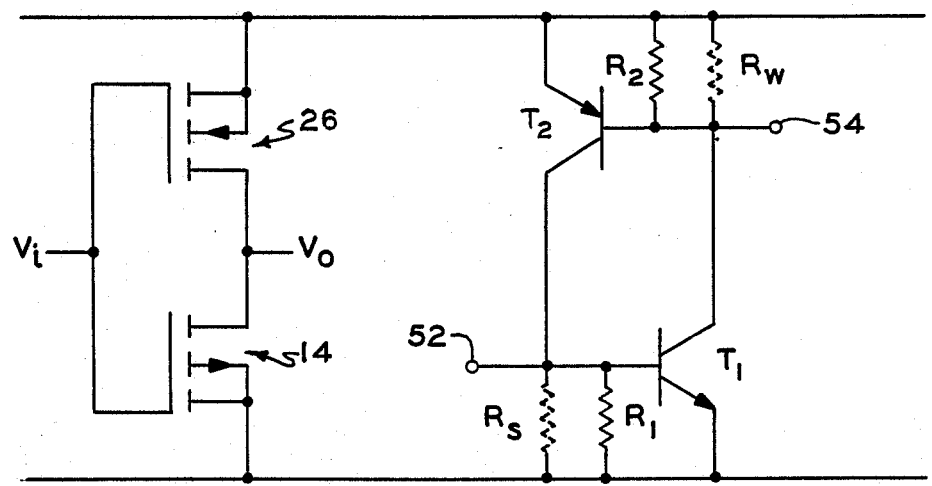
FIG. 4 is a schematic circuit of FIG. 3.

Since the path of unwanted injection current in FIG. 1 is from drains 18 or 32 to $V_{SS}$ or $V_{DD}$ respectively, $R_s$ and $R_w$ are large due to the relatively long distance that the unwanted injected current would travel before exiting through ohmic contacts 40 or 42. If an exit point for the unwanted injection current were afforded through leaky junctions at the lower boundaries of sources 16 or 30, $R_s$ and $R_w$ would be greatly reduced due to the shorter distance the unwanted current would travel through substrate 12 before existing device 10. In particular, in Figure 4, these lower resistances are shown as $R_1$ and $R_2$, respectively. FIG. 4 depicts $R_1$ and $R_2$ as shorting the corresponding higher resistance paths $R_s$ and $R_w$ ($R_s$ and $R_w$ are depicted in FIG. 4 in dashed lines since they no longer exist in device 56 due to the elimination of ohmic contacts 40 and 42). If $R_1$ and $R_2$ are small enough, the voltage drop across each due to the passage therethrough of the unwanted injection current will be less than the threshold voltages of $T_1$ and $T_2$, and therefore neither $T_1$ or $T_2$ will be turned on and the thyristor of FIG. 4 will never be activated.

In the first embodiment of the present invention, the jagged lines 58 and 60 at the lower boundary of sources 16 and 30 respectively, represent leaky junction regions formed by ion implantation. As is well known, ion implantation damages the crystal lattice structure of a monocrystalline solid due to the impact of the implanted ions. Depending on the dosage, the crystal structure can remain relatively crystalline or be rendered nearly amorphous. An amorphous crystal is a well recognized state of solid matter where a solid exhibits a considerable degree of short range order in its nearest neighbor bonds, but very little long range order.

Amorphous materials generally present higher resistivity than monocrystalline materials. Generally, the more regular the lattice structure (i.e., the more crystalline a solid is) the lower the resistivity. When energetic ions are introduced into a crystalline structure points defects, dislocation and other perturbations or damage occur. Such perturbations or damage can exist in considerable quantity prior to the crystal being transformed into an amorphous structure.

Sufficient leakage through junction regions 58 and 60 can generally be provided by damaging the associated lattice structure (i.e., generally, the lattice structure in the depletion region of junction regions 58 and 60, which is referred to herein as "at" a PN junction or "at" a boundary which forms part of a PN junction) less than what is necessary to transform it into an amorphous material. Junctions regions 58 and 60 can be tested to insure that they are sufficiently damaged by reverse biasing the junctions and looking for an approximate ohmic response at very low reverse bias voltages. Damage should thus be sufficient to render junction regions 58 and 60 substantially ohmic under reverse bias conditions (prior to reverse bias breakdown, of course).

Even though resistivity is increased when perturbations are introduced into a lattice structure, the resistivity of the damaged junction regions 58 and 60 relative to an unbiased or reverse biased undamaged PN junction is very low. If the depths of sources 16 and 30 are 0.5 MICRON or less, even if junctions 58 and 60 were damaged by considerable perturbations in the lattice structure, and such damage extended throughout source regions 16 and 30 to surface 50, the contribution to the total resistance $R_1$ or $R_2$ of the exit path for unwanted injection current would be relatively small. It is expected that even if source regions 16 and 30 included considerable perturbations throughout, the resistances R1 and R2 along said exit paths would be significantly less than resistances Rs and Rw of FIG. 1 (and this is true even if ohmic contact regions 40 and 42 abutted sources 16 and 30 respectively).

To further reduce R1 and R2 by minimizing the vertical dimensions of damaged junction regions 58 and 60, selected annealing of sources 16 and 30 to a depth just above the lower boundaries of sources 16 and 30 could be employed utilizing, for example, well known laser annealing techniques. A method of forming a structure in accordance with the first embodiment will be discussed further below.

The first embodiment, shown in FIG. 3 provides a CMOS with very leaky junctions regions 58 and 60 (it is probably more accurate to say that the PN junctions along the lower boundaries of sources 16 and 30 are effectively destroyed). Not only do leaky junction regions 58 and 60 allow unwanted current injected through drains 18 and 32 to exit by way of virtually the shortest possible paths through substrate 12 and well 28 respectively, it provides a concomitant benefit of providing substantially ohmic contacts to the well 28 and substrate 12 through sources 30 and 16 for $V_{SS}$ and $V_{DD}$.

Thus, latchup in the thyristor circuit of $T_1$ and $T_2$ in FIG. 4 is eliminated since the threshold voltages of $T_1$ and $T_2$ will not, in almost all cases, be exceeded. This is because the voltage dropped across the base of $T_1$ is now generated through small resistance R1 and the voltage drop across the base of $T_2$ is now generated through small resistance R2. Furthermore, the vertical portions of source 16-substrate 12 and source 30-well 28 junctions (which are still intact) remain unbiased because $V_{SS}$ is passed to substrate 12 through source 16 and leaky junction region 58 and leaky $V_{DD}$ is passed to well 28 through source 30 and leaky junction region 60 with virtually no voltage change. Also of importance is the fact that an extremely area conservative CMOS is provided since extra ohmic contacts 40 and 42 are not necessary, and latchup has been prevented without increasing the lateral dimensions of sources 16 and 30 or the lateral dimensions of the CMOS overall.

Figure 5:
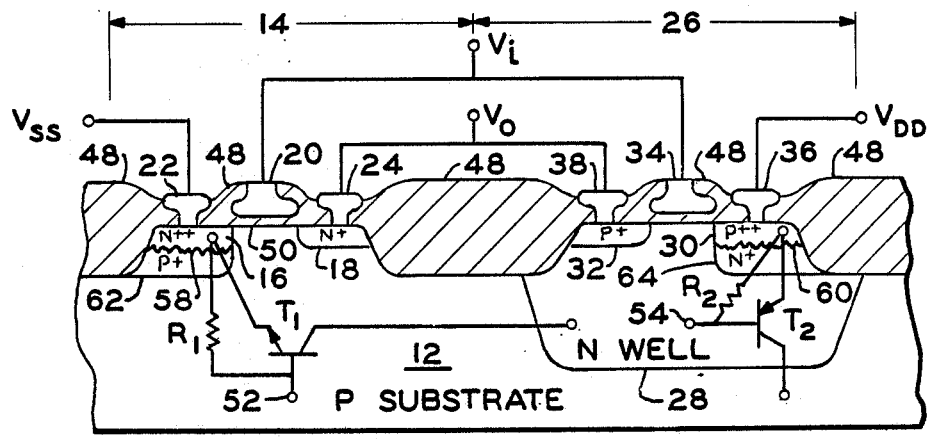
FIG. 5 is a schematic cross sectional view of a CMOS in accordance with the second embodiment of the present invention with lateral and vertical parasitic bipolar transistors superimposed thereon.

The second embodiment of the present invention is shown in FIG. 5. Here the first embodiment is built upon and enhanced by forming heavily doped regions 62 and 64 immediately adjacent and underlying leaky junction regions 58 and 60, respectively. These additional heavily doped regions 62 and 64 adjacent overlying, heavily doped sources 16 and 30, afford relatively high conductivity areas on each side of leaky junction regions 58 and 60. Even without leaky junctions regions 58 and 60, this combination of doping would render source 16-substrate 12 and source 30-well 28 junctions degenerative. Degenerative junctions have conduction bands on one side which lie within the valance band on the other and have very narrow depletion regions. Degenerative junctions allow substantial leakage due to tunneling at relatively low reverse bias voltages. The presence of the heavily doped regions 62 and 64 reduce the resistance to current moving through regions 62 and 64 relative to an undoped monocrystalline structure. Thus, unwanted injection current moving to leaky junction regions 58 and 60 through heavily doped regions 62 and 64 will produce a lower voltage drop than if regions 62 and 64 were not present.

If sources 16 and 30 and heavily doped regions 62 and 64 were doped very heavily (i.e., on the order of $10^{19}$ or $10^{20}$ atoms per cubic centimeter), some leakage would occur without the presence of leaky junctions regions 58 and 60, but is not probably that latchup can be consistently prevented by use of such heavy doping alone. It may be possible to prevent latchup by such very heavy doping in both the sources 16 and 30 and regions 62 and 64, but is highly preferable to employ leaky junctions regions 58 and 60 in conjunction with heavily doped regions 62 and 64.

Figure 6A:
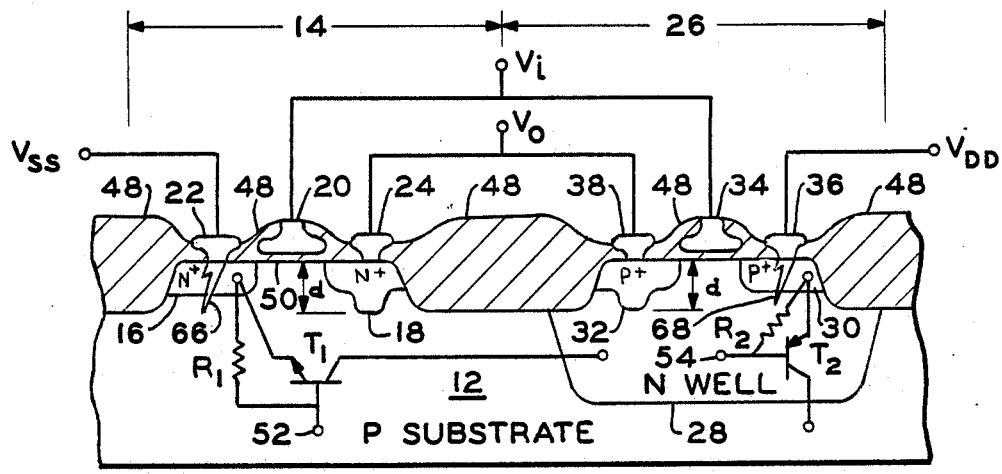
FIGS. 6A and 6B are schematic cross sectional views of CMOS's in accordances with third and fourth embodiments, respectively, of the present invention each employing spiked metallurgical contacts through the source regions, with lateral and vertical parasitic bipolar transistors superimposed on the CMOS's.
Figure 6B:
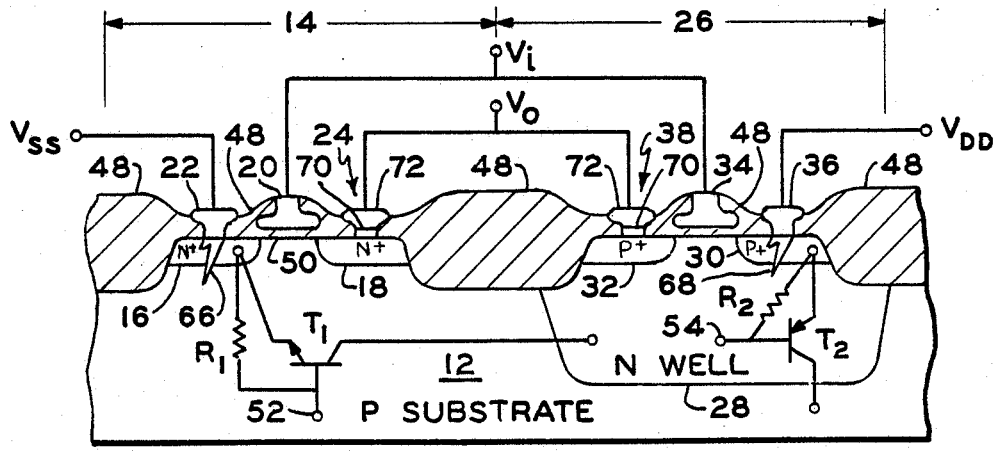

Third and fourth embodiments are depicted in FIGS. 6A and 6B respectively. Therein the base-emitter junctions of $T_1$ and $T_2$ are shorted by providing spiked metallurgical paths between contacts 22 and 26, and substrate 12 and well 28, respectively. FIG. 6A shows the third embodiment wherein spiked metallurgical paths 66 and 68 penetrate sources 16 and 30, respectively. The method of forming metallurgical spikes 66 and 68 (which will be discussed further below) provides a direct contact through the sources of MOSFETS 14 and 26 to the underlying well or substrate, and eliminates critical mask alignments necessary in processes which form high conductivity channels within the source regions 16 and 30 by standard photo-lithography. The sources 16 and 30 are preferably no more than 0.5 MICRONS deep to insure a very high probability of spiking when contacts 22 and 36 are formed. The drain region 18 and 32 have a double depth profile with the deeper portion lying immediately under overlying contacts 24 and 38 and being at least 1 MICRON deep (i.e., depth "d" in FIG. 6A) to virtually eliminate the possibility of spiking.

The fourth embodiment has the same structure as the third embodiment except the drains 18 and 32 can be formed to the same depths (i.e., 0.5 MICRONS) as source region 16 and 30. Spiking is prevented in the drains 18 and 32 by forming contacts 24 and 38 of two metal layers. The lower layer 70 is preferably a titanium-tungsten compound and the upper layer 72 can be aluminum. Layer 70 should be a metal or compound which will not go into solution readily with silicon during annealing and therefore not spike drains 18 and 32.

Typical dimensions of the devices shown in Figures 3, 5, 6A and 6B are source and drain widths of 4 MICRONS, source and drain depths of 0.5 MICRONS (except depth "d" in the drains of 6A which should be at least 1 MICRON), channel lengths of 1.5 MICRONS and a separation of 8.5 MICRONS between respective MOSFETS drains. A typical field oxide 48 thickness (i.e., above surface 50) is 0.5 MICRONS and a typical $+V_{DD}$ operating voltage is 5 volts.

Figure 7A:
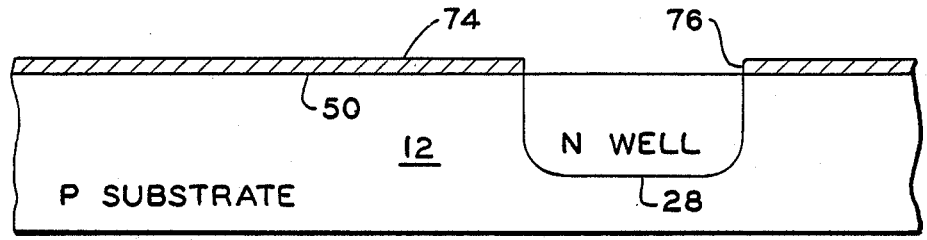

A CMOS in accordance with the first embodiment can be formed as shown in FIGS. 7A through 7E. In FIG. 7A, a silicon P-type substrate is provided. The principal upper surface 50 of substrate 12 is coated with a photoresist 74. A well opening 76 is masked (the mask is not shown) and photoresist 74 is exposed to light. Photoresist 74 is developed thus opening surface 50 above well 28. Well 28 is doped with N-type impurities by standard diffusion techniques. The results of these steps are shown in FIG. 7A. The first photoresist 74 is removed, see FIG. 7B, and a second photoresist 78 is applied to principal surface 50. A second mask (not shown) is applied to photoresist 78 to align drain 18 of transistor 14. Photoresist 78 is exposed through the second mask and developed to provide opening 80 above drain 18. Drain 18 is then preferably ion implanted to a depth of 0.5 MICRON with a concentration of on the order of $10^{16}$ atoms per cubic centimeter.

Figure 7B:
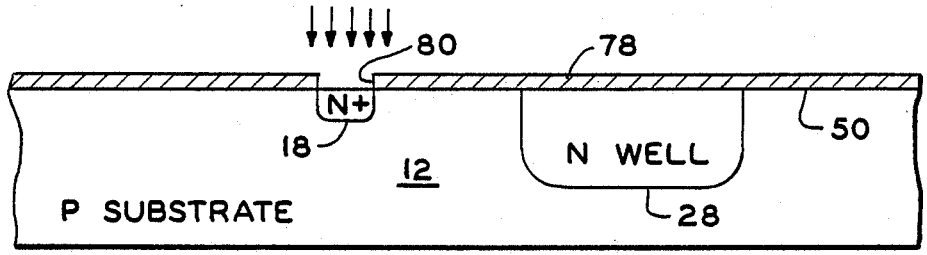
Figure 7C:
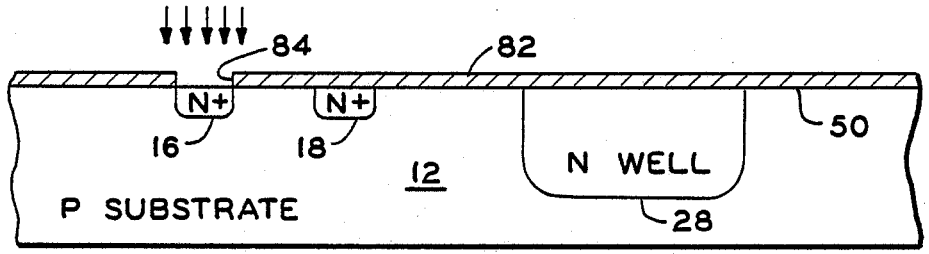

As shown in FIG. 7C, photoresist 78 is removed and the third photoresist 82 is applied to principal surface 50. A third photomask (not shown) is applied to photoresist 82 to align source 16 of transistor 14. Photoresist 82 is exposed through the third photomask and developed to provide opening 84 immediately above the site for source 16. Source 16 is then preferably ion implanted to a depth of 0.5 MICRONS with a concentration of $10^{16}$ atoms per cubic centimeter. Substrate 12 is then annealed at a temperature and for a duration sufficient to activate the impurities in source 16 and drain 18.

Figure 7D:
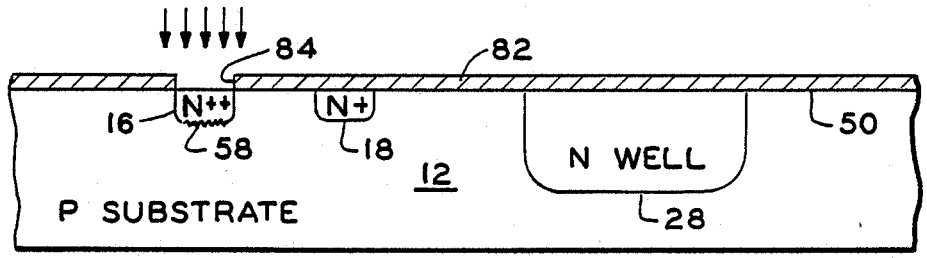

As is shown in FIG. 7D a second ion implantation step is employed through opening 84 to provide leaky junction region 58 at the lower boundary of source 16. For ease of processing, the same opening 84 is employed for the first and second ion implantations of source 16 and therefore, leaky junction region 58 will cover substantially all of the lower boundary of source 16. However, a further photoresist could be applied and a smaller opening than opening 84 could be opened for the second ion implantation if only a portion of the lower boundary of source 16 were to be damaged. The dosage for the second ion implantation is determined by the general rule of damaging the lower boundary of source 16 sufficient to provide a substantially ohmic contact between substrate 12 and source 16 through leaky junction region 58. Generally, raising the concentration of source 16 to $10^{19}$ atoms per cubic centimeter is sufficient.

Figure 7E:
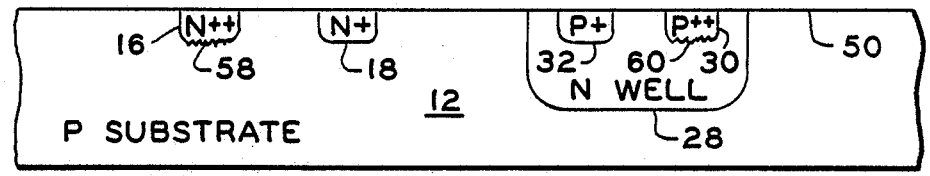

The results of a series of steps similar to those shown in FIGS. 7B, 7C and 7D, but altered to implant heavily doped source 30 and drain 32 for transistor 26, are shown in FIG. 7E. The structure of FIG. 3 is completed by standard LOCOS processing and the provision of contacts 22, 24, 36, 38 and gates 20 and 24 by standard processing.

If one were to construct a CMOS in accordance with the second embodiment, the same steps as shown in FIGS. 7A and 7B could be employed, but when opening 84 is provided in the third photoresist 82, heavily doped underlying region 62 could be ion implanted prior to the two ion implant steps to form overlying source 16. A similar triple ion implantation process could occur to form underlying heavily doped region 62 adjacent overlying source 30.

For further refinement, as discussed above, after the second ion implant step shown in FIG. 7D to form leaky junction region 58, selective annealing can occur at source 16. This could be accomplished, for example, by laser annealing of the upper portion of source 16. The upper portion of damaged source region 16 could be melted and epitaxially regrown by standard laser annealing techniques, taking care to leave the lower boundary of source 16 and leaky junction region 58 damaged.

Figure 8A:
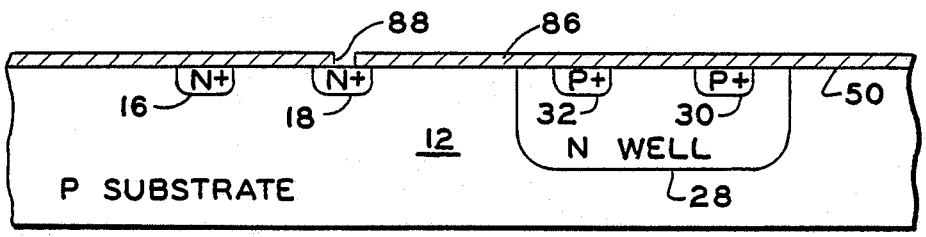
FIGS. 8A through 8D shows the result of a spiking metallurgy step in a method of making a device in accordance with the third embodiment.
Figure 8B:
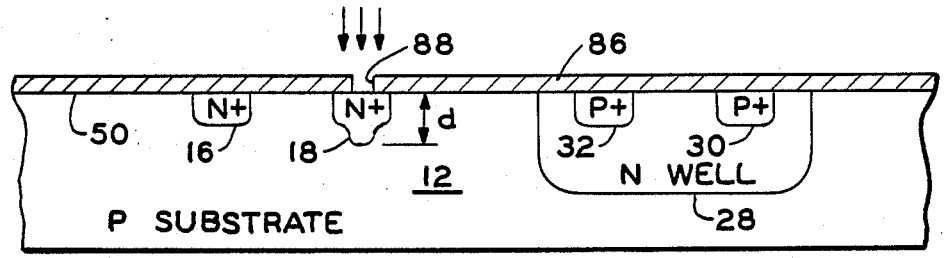

FIGS. 8A through 8D show a method of forming a CMOS device in accordance with the third embodiment which employs spiking metallurgy. FIG. 8A depicts a basic CMOS structure with well 28 and with the sources and drains of transistors 14 and 26 already ion implanted. FIG. 8A also shows photoresist 86 applied to principal surface 50 and opened at opening 88 above the general central region of drain 18. Substrate 12 has been annealed to activate the impurities in the drain and source regions of MOSFETS 14 and 26. In FIG. 8B, a further ion implantation step is performed through opening 88 to provide an extra deep region in the approximate center of drain 18. The energy of the second ion implant in drain 18 is chosen to provide the extra deep region to depths "d" which is preferably at least 1 MICRON. Further annealing of substrate 12 would follow this second ion implant step.

Figure 8C:
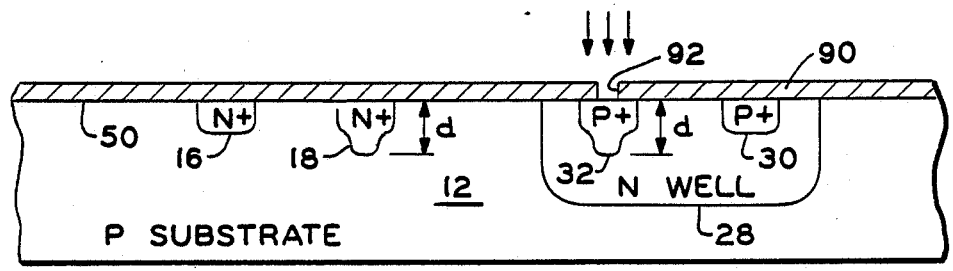
Figure 8D:
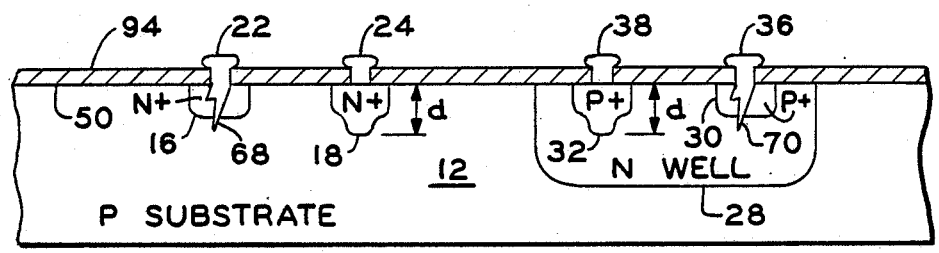

As shown in FIG. 8C, photoresist 86 has been removed from principal surface 50 and a new photoresist 90 applied thereto. Photoresist 90 is masked (the mask is not shown) and opening 92 provided in the approximate center of drain 32. Again, as with drain 18, a second ion implant step is performed above drain 32 so that the extra deep profile at the approximate center of drain 32 is provided to at least 1 MICRON. Annealing follows this second ion implantation in drain 32. FIG. 8D shows the results of removing photoresist 90 and applying photoresist 94 to principal surface 50. Four metal contact openings would then be provided at the approximate center regions of sources 16 and 30 and drains 18 and 32.

It is preferred that silicon be used as the substrate material and that aluminum-copper (2-4% copper) be used to provide the respective source and drain contacts as well as the gate contacts. As is well known, metallization of the contact area causes some damage to the surface 50 of silicon substrate 12. Therefore, annealing occurs after metallization to substantially correct the damage. However, if aluminum-copper is employed as the contact metal, the underlying silicon will go into solution with the aluminum contact drain annealing. Since the source depths have been limited to 0.5 MICRONS, in the process of the formation of the silicon-aluminum solution, there is a very high probability that a spike or spikes would be formed from contacts 22 and 36 (which overly source regions 16 and 32, respectively) to the underlying substrate 12 or well 28. The extra deep profile provided for drains 18 and 32, will prevent any spikes which form in the drain from penetrating to the underlying substrate 12 or well 28. FIG. 8D shows metallized contacts 22, 24, 36 and 38 in place with the spikes or spikes shown in schematic form through sources 16 and 30 as numbers 66 and 68, respectively. The structure of the third embodiment will be completed by LOCOS and the formation of gates 20 and 34 as shown in FIG. 6A.

Figure 9A:
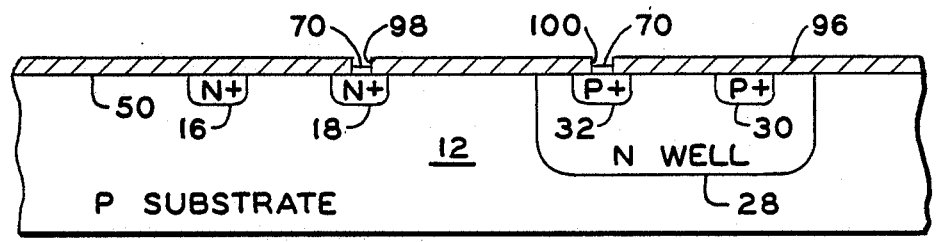
FIGS. 9A and 9B shows the results of a spiking metallurgy step in a method of making a device in accordance with the fourth embodiment which further includes barrier metallurgy processing.
Figure 9B:
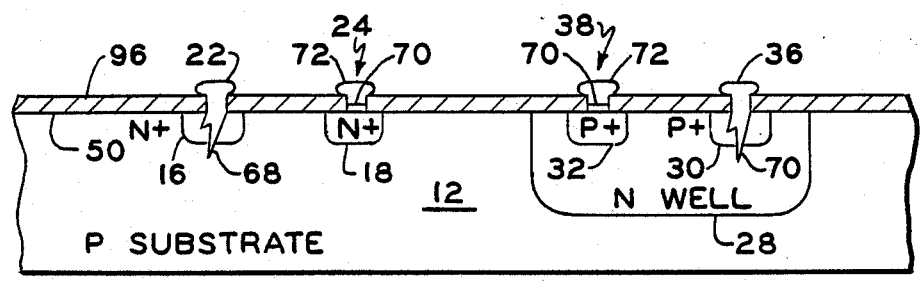

Some steps in the formation of a device in accordance with the fourth embodiment are shown in Figures 9A and 9B. In FIG. 9A, a basic CMOS structure is provided as shown in FIG. 8A. Additionally, a photoresist 96 is shown applied to principal surface 50 with two openings 98 and 100 formed therein over the approximate central regions of drains 18 and 32, respectively. Metallized layer 70 is then formed in openings 98 and 100, respectively, on principal surface 50. Metallized layer 70 should be comprised of a metal or metals which will not readily go into solution with the semiconductor or well substrate material during annealing. It is preferable that the substrate 12 again be silicon and layer 70 be titanium-tungsten compounds. After layer 70 is formed (for example, by standard vacuum deposition) the resultant damage immediately under layer 70 to principal surface 50 will again be annealed out. However because a titanium-tungsten compound will not readily go into solution with silicon, a 0.5 MICRON depth for drains 18 and 32 will effectively prevent any penetration by spikes from layer 70 into substrate 12 or well 28 through drains 18 or 32.

FIG. 9B shows the results of the subsequent opening of contact areas above the approximate central regions of the sources 16 and 30, and the subsequent metallization with aluminum contacts of the openings above sources 16 and 30 as well as openings 98 and 100. Again, spikes 66 and 68 are formed upon the annealing out of damage to principal surface 50 due to the metallization. A structure according to the fourth embodiment is completed as shown in FIG. 6B.

Although the present invention has been described in terms of a specific integrated circuit, many variations within the scope of the claimed invention are possible. Similarly, the particular steps disclosed in forming the various preferred embodiments are given by way of example only and many variations in the processes of photo-lithography, diffusion, ion implantation and spiking metallurgy are possible.

The above invention could further be employed in any semiconductor device wherein it was desirous and advantageous to use an active device region as an ohmic contact to another region of the semiconductor device adjacent the active region.

It can be seen from the above description that a device constructed in accordance with the description will achieve at least all the state objectives.

What is claimed is:

1. A solid state device, comprising:
a substrate of a substantially monocrystalline semiconductor material including a principal surface, said principal surface having a substantially flat portion;
an insulating material overlying part of said flat portion;
a first region in said substrate extending into said substrate from said principal surface and being doped with a first conductivity type;
second and third regions in said substrate wherein said second and third regions are spaced apart from each other along said flat portion by a part of said first region, said second and third regions each extending into said substrate from said principal surface and each being doped with a second conductivity type, and wherein said second and third regions form first and second junctions, respectively, of said first and second conductivity types within said substrate, and wherein at least a part of each of said first and second junctions intercepts said flat portion;
a first conductive means overlying at least a part of said space between said second and third regions and being separated from said flat portion by said insulating material;
a fourth region in said substrate at said first junction wherein said monocrystalline material is damaged to an extent sufficient to provide a low resistivity path through said first junction, the resistivity of said low resistivity path being lower than the resistivity of said first junction when said first junction is undamaged and unbiased by electrical potentials, and wherein said fourth region is separated from said flat portion by said substrate;
a fifth region in said substrate extending into said substrate from said principal surface and being doped with said second conductivity type;
sixth and seventh regions in said substrate wherein said sixth and seventh regions are spaced apart from each other along said flat portion by a part of said fifth region, each extend into said substrate from said principal surface and each are doped with said first conductivity type, and wherein said sixth and seventh regions from third and fourth junctions, respectively of said first and second conductivity types with said fifth region, and wherein at least a part of each of said third and fourth junctions intercepts said flat portion;
a second conductive means overlying said space between sixth and seventh regions and being separated from said flat portion by said insulating material;
an eighth region in said substrate at said third junction wherein said monocrystalline material is damaged to an extent sufficient to provide a second low resistivity path through said third junction, the resistivity of said second low resistivity path being lower than resistivity of said third junction when said third junction is undamaged and unbiased by electrical potentials, and wherein said eighth region is separated from said flat portion by said substrate;
a ninth region in said substrate, adjacent to said fourth region and on the opposite side of said first junction from said second region, said ninth region being heavily doped with said first conductivity type and separated from said flat portion by said substrate; and
a tenth region in said substrate adjacent to said eighth region and on the opposite side of said third junction from said sixth region, said tenth region being heavily doped with said second conductivity type and separated from said flat portion by said substrate.

2. The device of claim 1 wherein the doping levels of said ninth and tenth regions are each at least $10^{19}$ atoms per cubic centimeter.

3. A method of preventing latch-up in parasitic bipolar transistors in a complementary insulated gate field effect transistor (CIGFET), wherein said CIGFET includes a substrate of a substantially monocrystalline material having a principal surface with a substantially flat portion, an insulating layer overlying a part of said flat portion and wherein said CIGFET includes first and second IGFETS, said first IGFET having a first source, first drain and first conductive gate, with said first source and said first drain being spaced from one another along said flat portion and with said first gate overlying said space between said first source and first drain, said second IGFET having a second source, second drain, and second conductive gate, with said second source and said second drain being spaced from one another along said flat portion and said second conductive gate overlying said space between said second source and said second drain, and wherein said first source forms a first junction of said first and second conductivity types with a first part of said substrate and said second source forms a second junction of said first and second conductivity types with a second part of said substrate, comprising:

damaging said monocrysatalline substrate material at a first location on said first junction sufficiently to provide a first low resistivity path through said first junction, the resistivity of said first low resistivity path being lower than the resistivity of said first junction when said first junction is undamaged and unbiased by electrical potentials, and wherein said first location is separated from said flat portion by said substrate;

damaging said monocrystalline substrate material at a second location on said second junction sufficiently to provide a second low resistivity path through said second junction, the resistivity of said second low resistivity path being lower than resistivity of said second junction when said second junction is undamaged and is unbiased by electrical potentials, said second location being separated from said flat portion by said substrate;

heavily doping a first region adjacent to said first location and on the opposite side of said first junction from said first source region with the opposite conductivity type of said first source region, said first heavily doped region being separated from said flat portion by said substrate; and heavily doping a second region adjacent said second location on the opposite side of said second junction from said second source region with the opposite conductivity type of said second source region, said second heavily doped region being separated from said flat portion by said substrate.

* * * * *